United States Patent [19]

Rast, Jr. et al.

[11] 4,048,568

[45] Sept. 13, 1977

[54] WIDE OPERATING FREQUENCY RANGE SUPERHETERODYNE FM NOISE ANALYZER

[75] Inventors: Gustaf J. Rast, Jr.; Thomas A. Barley; Raiford L. Hammond, all of Huntsville, Ala.; James R. Ashley, Colorado Springs, Colo.

[73] Assignee: The United States of America as represented by the Secretary of the Army, Washington, D.C.

[21] Appl. No.: 718,723

[22] Filed: Aug. 30, 1976

[51] Int. Cl.² .......................................... H04B 17/00
[52] U.S. Cl. .................................. 325/363; 324/57 H; 324/57 N; 324/77 B; 324/83 Q; 324/85; 325/435
[58] Field of Search ................... 325/45, 67, 333, 344, 325/345, 349, 363, 435, 474; 324/57 H, 57 N, 77 R, 77 A, 77 B, 77 D, 77 E, 83 R, 83 Q, 85; 329/110, 124, 140

[56] References Cited

U.S. PATENT DOCUMENTS

| 2,964,622 | 12/1960 | Fire | 325/435 |
|---|---|---|---|
| 3,079,563 | 2/1963 | Marsh et al. | 325/349 |
| 3,913,013 | 10/1975 | Barley et al. | 324/77 B |

*Primary Examiner*—Robert L. Griffin
*Assistant Examiner*—Marc E. Bookbinder
*Attorney, Agent, or Firm*—Nathan Edelberg; Robert P. Gibson; Freddie M. Bush

[57] ABSTRACT

It is desirable to be able to measure the FM noise spectra of signals whose carrier power is less than the minimum power level at which a direct non-amplified analyzer can operate satisfactorily. Generally a carrier less than approximately + 2 dbm would require analysis by a very low power measuring system.

In the superheterodyne analyzer the discrimination process for a high frequency input signal is accomplished at a suitable intermediate frequency. A single set of discrimination equipment is utilized in the measurement of a wide carrier frequency range of input signals using relatively narrow band intermediate frequency hardware to optimize the analysis function. This provides a means for measuring frequencies from 4 GHz to 8 GHz or from 2 MHz to 2 GHz for example, with high accuracy and sensitivity, while using the same intermediate frequency hardware limited to operational bandwidths of a few MHz. A balanced phase detector, power dividers, attenuators coupled with an optimum length transmission line and balanced mixing of signal and reference signals at an IF level coupled with frequency translation provide frequency discrimination over a wide carrier frequency range.

8 Claims, 6 Drawing Figures

WIDE OPERATING FREQUENCY RANGE SUPERHETERODYNE FM NOISE ANALYZER

DEDICATORY CLAUSE

The invention described herein may be manufactured, used, and licensed by or for the Government for governmental purposes without the payment to us of any royalties thereon.

BACKGROUND OF THE INVENTION

The use of frequency discrimination to measure near carrier frequency modulation noise of a microwave signal is discussed by Ashley et al in the IEEE Transactions on Microwave Theory and Techniques, Volume MTT-16, No. 9, September 1968, pages 753–760. Prior art discrimination at microwave frequencies, as described in this paper, depended on a microwave cavity as a resonant circuit. Prior art discrimination at very high frequencies (VHF) utilize such components as slope detectors and ratio detectors, depending on the lumped circuit elements of inductance and capacitance, to form resonant circuits. Prior art at all frequencies tend to use amplifiers at either signal or IF to enable measurements to be made on low level signals. At ultra-high frequencies (UHF) between the VHF and microwave region, there is little prior art on such discrimination means. Most measurements in this area are made by heterodyning the UHF signal with a local oscillator to obtain a VHF signal which is analyzed with a discriminator at a VHF frequency range. Both the cavity method and the lumped circuit element method obtain rejection of residual amplitude modulation (AM) noise on the signal under test; for example, the VHF discriminator usually employs a limiter or ratio detector. The microwave cavity discriminator rejects AM noise and also allows the input signal level to be increased, and provides the greatest discriminated output to improve the signal-to-threshold ratio, with the threshold being the lowest value of noise established or obtained within the analyzer system.

Among the discriminators discussed in prior art literature which might be useful in making FM noise measurements at UHF or lower microwave frequencies is the transmission line discriminator as has been noted by R. A. Campbell in "Stability Measurement Techniques in the Frequency Domain", IEEE-NASA Symposium on Short Term Frequency Stability, NASA SP-80, Nov. 23–24, 1964, pages 231–235. Various aspects of detection equipment and calibration are disclosed. Also, the IEEE Transactions on Microwave Theory and Techniques, Volume MTT-23, No. 9, September 1975, pages 776–778, an article entitled "Single Hybrid Tee Frequency Discriminator" by J. Nigrin et al discloses a discriminator tuned by a movable short and has properties comparable to those of a phase discriminator. Additional prior art includes Pat. No. 3,675,124 entitled "Apparatus for Measuring Frequency Modulation Noise Signals and for Calibrating Same" by J. R. Ashley et al. This apparatus employs an auxiliary injection phase-locked oscillator driven by a test oscillator and relies on a discriminator cavity resonator which must be accurately tuned to the exact operating frequency for acceptable operation. Ashley et al discusses in column 6 the difficulty of making signal measurements where limited power outputs make prior art methods ineffective.

Similarly, U.S. Pat. No. 3,079,563 entitled "Microwave Frequency Discriminator" by Marsh et al discloses a discriminator wherein input signals are changed to an IF level before being applied to a detector. Marsh et al discuss the limits and feasibility of high Q cavities.

Applicants have related co-pending patent applications which also utilize the optimum length transmission line in discriminator devices. These related applications are:

Ser. No. 652,593 filed Jan. 26, 1976 and entitled "Optimum Threshold Transmission Line Discriminator", now U.S. Pat. No. 4,002,970;

Ser. No. 652,446 filed Jan. 26, 1976 and entitled "Wide Operating Frequency Range Transmission Line Discriminator", now U.S. Pat. No. 4,002,971; and Ser. No. 652,445 filed Jan. 26, 1976 and entitled "Optimum Length Transmission Line Discriminator with Low Noise Detector", now U.S. Pat. No. 4,002,969.

SUMMARY OF THE INVENTION

The wide operating frequency range superheterodyne analyzer relates to measurement of frequency modulation noise at sub-microwave and microwave carrier frequencies having low signal power, in the order of + 2 dbm or less, for example. Measurement is enhanced by the use of a high Q cavity resonator or an optimum length transmission line and intermediate frequency (IF) amplifiers, providing AM noise rejection, ease of operation and threshold determination with low input signal power. the analyzer operates in the high, very high, ultrahigh, and microwave frequency regions measuring FM noise by superheterodyning incoming signals with established oscillator signals, allowing high sensitivity measurements to be obtained. The signal-to-threshold is improved, the system measurement threshold is readily determined, incidental amplitude modulation (AM) on the signal under test is rejected, and the measured FM noise can be corrected for the established measurement threshold. By using a relatively narrow band intermediate frequency (IF) with the discriminator operating at this IF, noise measurement can be accomplished at lower signal levels than by using equipment operating at the input signal frequency. The intermediate frequency may be above the signal frequency to allow the use of a high Q cavity resonator to increase discrimination sensitivity.

DESCRIPTION OF THE PREFERRED EMBODIMENTS

Figure 1:
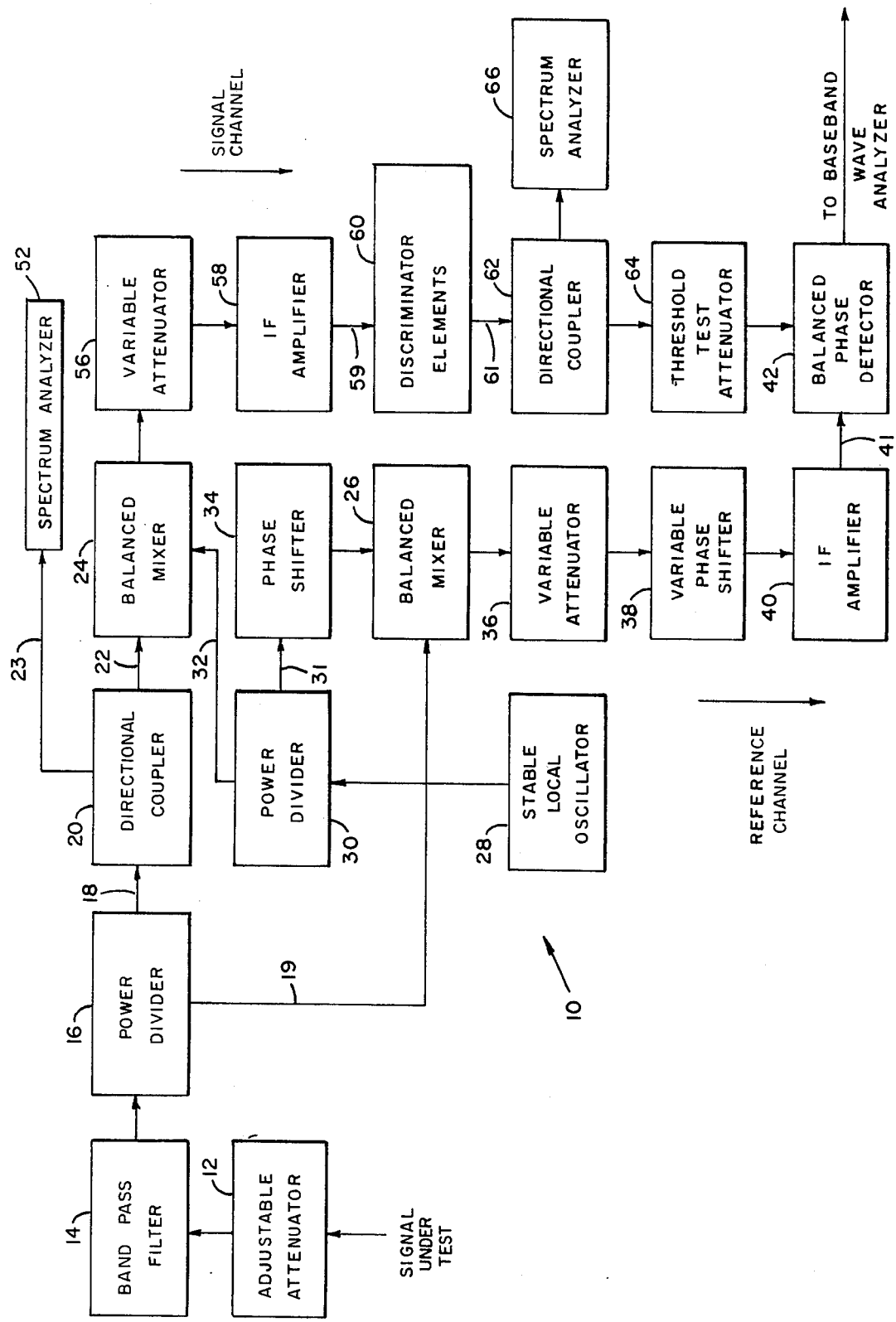
FIG. 1 is a block diagram of a preferred embodiment of the wide operating frequency range superheterodyne FM noise analyzer.

Referring now to the drawings wherein like numbers represent like parts in each of the several figures, FIG. 1 discloses a preferred embodiment of a superheterodyne analyzer 10 wherein a signal under test is coupled as an input to an adjustable attenuator 12. The output of attenuator 12 is connected as an input to a bandpass filter 14. The output of filter 14 is coupled to a power divider 16 which divides the input signal into outputs 18 and 19. Output 18 is coupled as an input to a directional coupler 20. A first output 22 from directional coupler 20 is coupled as an input to a balanced mixer 24, and a second output 23 is coupled to a spectrum analyzer 52 for sampling the signal passing through coupler 20 to mixer 24. Output 19 of power divider 16 is coupled as an input to a balanced mixer 26. The signals coupled into mixers 24 and 26 are combined with a local oscillator frequency and establish respective signal and reference channels.

A stable local oscillator 28 has an output coupled to power divider 30 which splits the power into two paths 31 and 32. Output path 31 is coupled to a phase shifter 34. The output of phase shifter 34 is connected to balanced mixer 26, and the output of mixer 26 is coupled in series through a variable attenuator 36, a variable phase shifter 38, and an amplifier 40 to an input 41 of balanced phase detector 42, providing a reference channel input to detector 42. Output 32 is coupled as an input to balanced mixer 24. Mixer 24 combines the two incoming signals and has an output coupled in series through a variable attenuator 56, an amplifier 58, a discriminator element stage 60, a directional coupler 62, and a threshold test attenuator 64 to another input of balanced phase detector 42, providing a signal channel input to detector 42. The output signal from detector 42 is disposed for coupling to established baseband wave analyzer equipment. A spectrum analyzer 66 is coupled to an output of coupler 62 for sampling the signal passing therethrough. Discriminator stage 60 is shown with an input 59 from amplifier 58 and with an output 61 to directional coupler 62 for convenient referencing in FIGS. 2-5.

Figure 2:
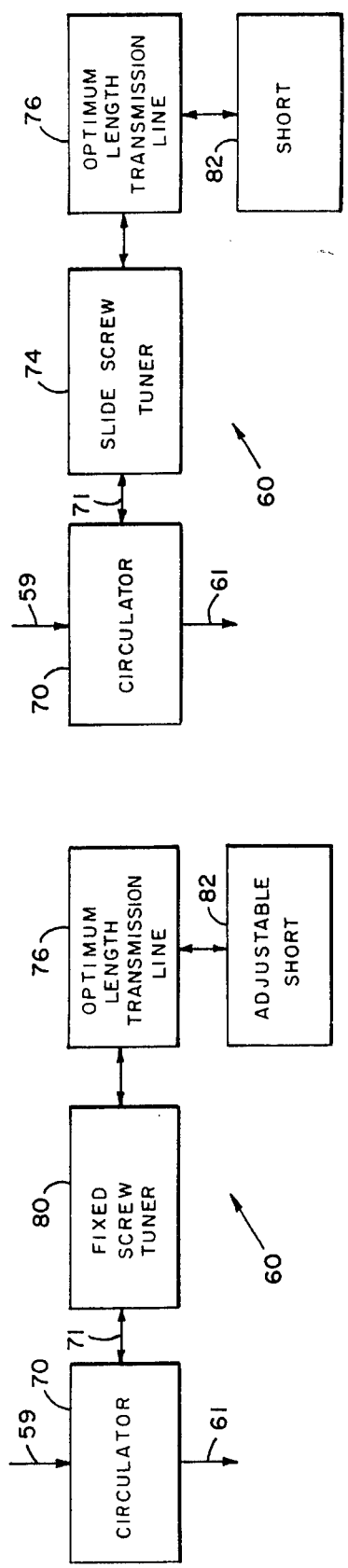

FIGS. 2-5 disclose various discriminator circuits which are operable as the discriminator element stage 60 of analyzer 10. FIG. 2 discloses the discriminator input 59 to be coupled into a circulator 70 and an output 61 to be coupled from the circulator to coupler 62. A port 71 of circulator 70 is coupled through a fixed screw tuner 80 to an optimum length transmission line 76. An adjustable short circuit 82 coupled to optimum line 76 allows fine tuning for the discriminator.

Figure 3:
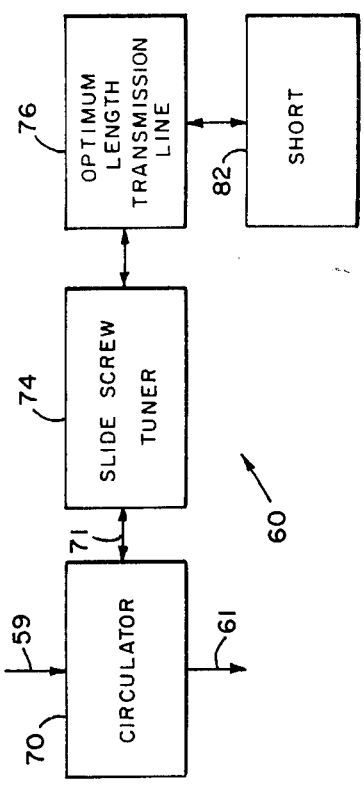
FIG. 2–5 are alternative embodiments of the analyzer discriminator elements.

FIG. 3 shows the circulator 70 of the discriminator element stage with port 71 being coupled to a slide screw tuner 74. Signals coming into circulator 70 are routed through tuner 74 and through an optimum length transmission line 76 coupled thereto to a short circuit 78 where the signal is reflected back to the circulator for coupling out port 61.

Figure 4:
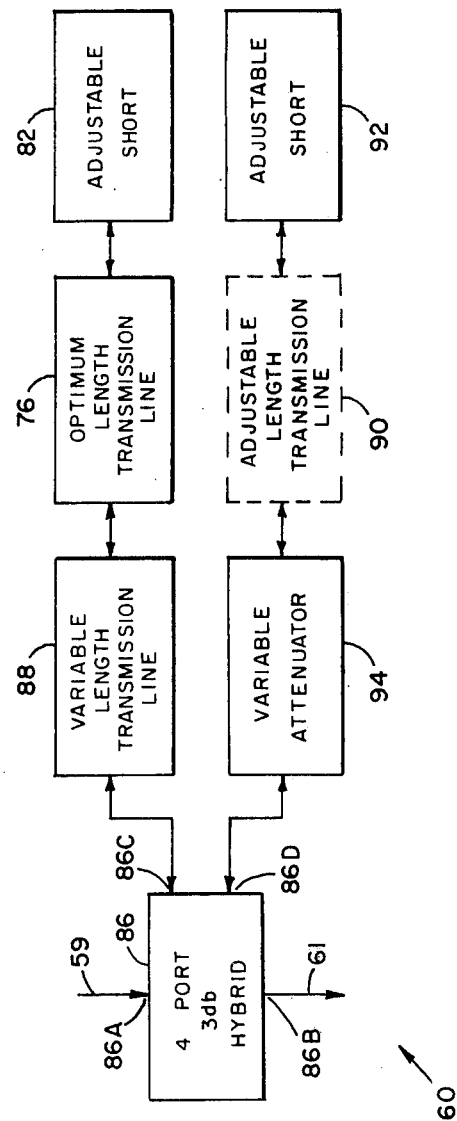

FIG. 4 discloses an embodiment of the discriminator element stage 60 to include a hybrid 86 replacing circulator 70. Input port 86A is coupled to discriminator input 59 and output port 86B is coupled to output 61. Optimum length line 76 is coupled to adjustable short circuit 82 and is coupled through a variable length transmission line 88 to input-output port 86C of the hybrid. An adjustable length transmission line 90 is coupled to a short circuit 92 and is coupled through a variable attenuator 94 to input-output 86D of hybrid 86. In operation of this embodiment variable length line 88 and adjustable length line 90 are components that enhance precise tuning in the discriminator element stage and may be omitted entirely or may be operable in various combinations. For example with elements 88 and 90 both omitted, attenuator 94 and short circuit 92 remain coupled to port 86D; optimum line 76 and short circuit 82 are coupled to port 86C with short circuit 82 providing tuning adjustment or with short circuit 92 providing tuning adjustment. Similarly, either variable length line 88 or adjustable line length 90 may provide discriminator fine tuning adjustments without adjusting the respective short circuits at the ends of the lines.

Figure 5:
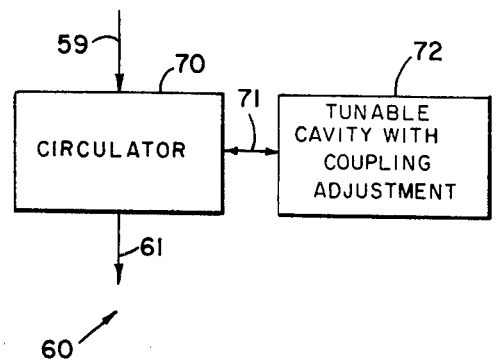
Figure 6:
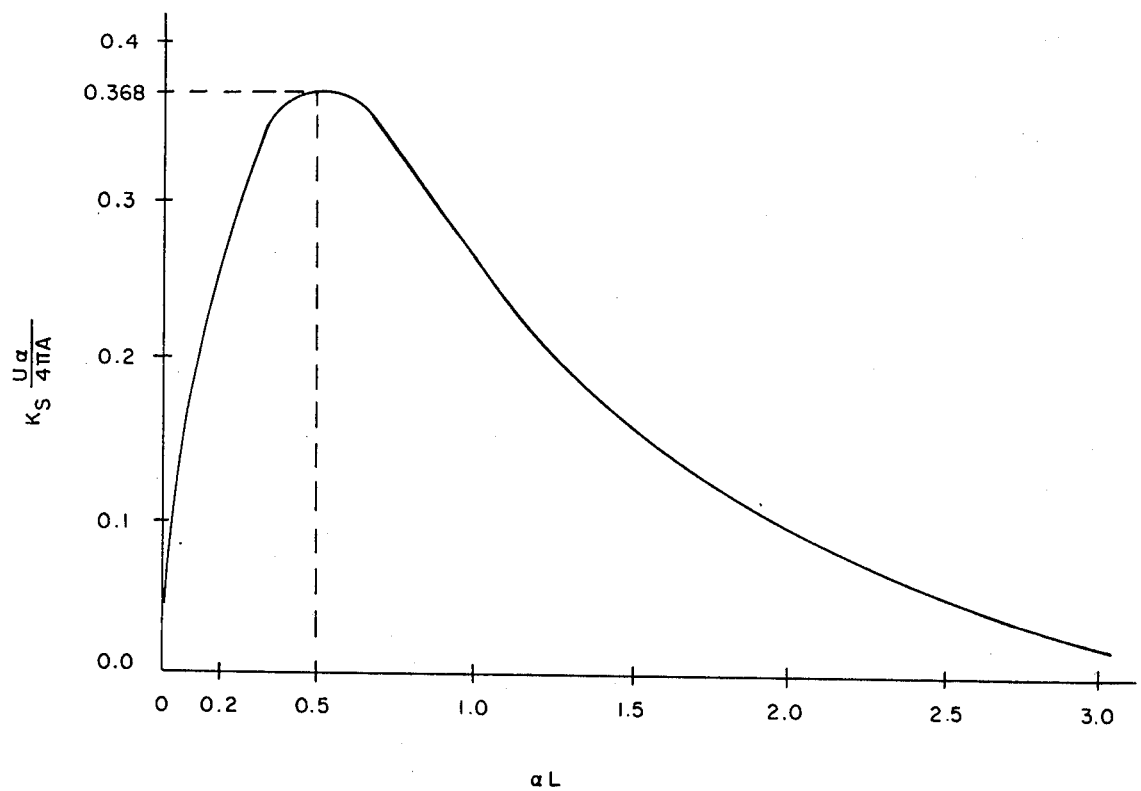
FIG. 6 is a graph of the optimum length transmission line discriminator element normalized sensitivity versus transmission line length.

The embodiment of FIG. 5 discloses port 71 of circulator 70 to be coupled to a cavity 72. Energy is routed through the cavity before being coupled out port 61. The rleative sensitivity curve of the optimum length transmission line discriminator is shown normalized in FIG. 6. The optimum length of the line occurs when $\alpha L = 0.5$ and gives maximum sensitivity to the measurement apparatus with $\alpha$ being determined at the intermediate frequency. These characteristics are derived either through trigonometric or exponential derivations beginning with fundamental equations such as Helmholtz's equations. An important feature of this optimized line as noted in FIG. 6 is that the peak of the line length versus optimum output is a broad shape and not a sharp peak.

The optimum length transmission line 76 is always determined at a particular design intermediate frequency. For the design frequency the optimum length line is always the electrical length of line at which total attenuation is one neper (8.68 decibels). As shown in FIG. 6, this length occurs for the particular embodiment after the signal has traversed the line and been reflected back through the line. Because of the broad bandwidth of utilization before sensitivity deteriorates, a single optimum length line such as a coaxial cable used in the discriminator element stage allows a broad range of frequency measurement to either side of the optimum frequency before noticeable loss of sensitivity affects operation of the circuit. In FIG. 6, the transmission line length is L, attenuation per unit length of line is $\alpha$, line transmission velocity, is U, A is the amplitude in volts of the signal applied to the transmission line, and $K_s = \Delta v/\Delta f$ is the discriminator sensitivity in volts ($\Delta v$) per Hertz deviation ($\Delta f$). Utilizing 3 db sensitivity degradation as the controlling factor for the optimum line length allows an operating frequency range within 0.4 to 2.1 nepers of total attenuation.

It is common knowledge among those skilled in the art to establish calibration in related analyzer systems using known FM side band levels. Two basic techniques used in calibration are a direct carrier nulling operation and an indirect sideband level magnitude operation. The direct technique involves FM modulating a source with sufficient driving power to reach a condition wherein the carrier vanishes. Adding attenuation in the modulation signal source then allows a known sideband level to be established (40 db below the carrier at 18,600 Hertz is a widely used reference). This method is very useful on devices such as Klystrons which can easily be modulated by inserting the modulating source into the Klystron repeller circuit. However this method does not work when the source is a highly stable crystal oscillator.

The indirect technique can be done in one of two ways. A substitution technique may be used or the source can be separated from the discriminator and an angle modulating circuit can be inserted between these two units to establish calibrated sidebands on the source. The carrier substitution method requires that a second source which can be easily modulated be substituted for the signal source to be measured. The carrier level of the substitute source accurately matched in frequency and amplitude to the signal source to be measured. The substitute source then provides the sidebands at known levels accomplished the calibration. After calibration, the signal to be measured is reconnected to the discriminator and the measurement is made using the calibration set up by the substitute source.

For the second indirect calibration technique, a modulating circuit is inserted between the source to be measured and the analyzer and uses a small portion of the signal power as a base upon which sidebands are generated. These sidebands and then calibrated on a spectrum analyzer and properly phase shifted to be reinserted on the source signal as FM sidebands (of the desired magnitude).

With the application of a calibration signal with known FM sidebands, balanced phase detector 42 is now ready for adjustment. Alignment of detector 42 involves setting variable phase shifter 38 for a maximum baseband analyzer readout with the appropriate power level in the reference channel and a properly nulled signal channel input both applied simultaneously to balanced phase detector 42. Spectrum analyzer 52 is used to determine proper sideband levels on the calibration input signal. The phase detector 42 output is applied to the baseband analysis equipment (not shown) which is tuned to the angle modulation frequency and observed during the calibration process.

The bandpass filter of the baseband analysis equipment (not shown) is set for the angle modulation frequency which is supplied at a known level by the calibration signal. The phase detection process is optimized by adjusting phase shifter 38 for a maximum output signal level at the output of this bandpass filter. Completion of the calibration requires that the readout device in the baseband analysis equipment be used to record the maximized output of the bandpass filter. This calibrates the entire system.

A noise measurement is then made by applying the signal to be analyzed to attenuator 12. The FM noise is measured and recorded by the baseband equipment using the desired filter bandwidths and covering the desired modulation frequency range. Adjustable attenuator 12 allows the input signal magnitude to be adjusted as required to acceptable operation at the mixers 24 and 26. As a consequence of having a capability for operating over a wide frequency range, bandpass filter 14 selects the desired frequency to be analyzed while restricting other signals which may be present in the source. The bandpass filter also controls possible imaging from other frequencies which may be present in the source.

After a signal has been selected and adjusted in amplitude by adjustable attenuator 12 and bandpass filter 14, this signal is split in two parts by power divider 16. One part of the signal from power divider 16 is sent to directional coupler 20 and the other part is sent to balanced mixer 26. Directional coupler 20 couples the signal as an input to balanced mixer 24 while allowing spectrum analyzer 52 to sample the signal. Spectrum analyzer 52 provides measurment of the input carrier and sideband power levels to the mixers and provides the calibration of the discriminator conversion sensitivity.

The output signal from local oscillator 28 is divided and coupled to mixers 24 and 26 for mixing with the input frequency. The phase shifter 34, which couples the local oscillator frequency into mixer 26, allows independent adjustment of the relative phase shift between the IF signal path and the IF reference path.

Mixers 24 and 26 shift the input frequency into the intermediate frequency range where the discrimination operation is accomplished. Functionally, mixer 26 is the start of the intermediate frequency reference channel which encompasses variable attenuator 36 variable phase shifter 38, amplifier 40 and the reference input to balanced phase detector 42. Variable attenuator 36 allows amplifier 40 to be a fixed gain amplifier while permitting an acceptable input power level to balanced phase detector 42. In practice, variable attenuator 36 can be integrated into amplifier 40 to form a variable gain amplifier. The basic operation in both cases is the same. Phase shifter 38 provides the capability of establishing a quadrature condition at balanced phase detector 42 during alignment. The function of the reference channel is thus basically to insure adequate power to operate balanced phase detector 42 and provide a means to establish quadrature phase detection.

The signal channel is functionally comprised of mixer 24, variable attenuator 56, amplifier 58, discriminator 60, directional coupler 62, spectrum analyzer 66, threshold test attenuator 64 and the signal input input balanced phase detector 42. Variable attenuator 56 and amplifier 58 are virtually accomplishing the same function in the signal channel that variable attenuator 36 and amplifier 40 perform in the reference channel. Amplifier 58 drives discriminator element 60 and does not directly drive balanced phase detector 42. Amplifier 58, by its's very nature will have some additive noise both amplitude modulated and frequency modulated. Placing this amplification ahead of the discriminator operation eliminates any added amplitude modulated noise through the normal cancellation process conducted in discriminator element stage 60. Thus, only a possible input signal degradation of a frequency modulated nature is of concern. Careful selection of parameters in implementing this amplifier 58 will minimize any amplifier additive noise effects on the signal being analyzed.

The signal carrier from amplifier 58 is received by discriminator element stage 60 wherein the IF signal carrier is nulled allowing a suppressed carrier signal to be routed from discriminator element 60 to directional coupler 62.

The processed signal from discriminator element 60 is received by directional coupler 62 where it is divided into two parts. The smallest portion of this signal is sent to spectrum analyzer 66 where the discriminator process described above can be monitored to assure proper results are obtained. The remaining part of this signal is sent to threshold attenuator 64 and then to balanced phase detector 42. Threshold test attenuator 64 is normally set for minimum attenuation during measurement of an incoming signal. During the process of determining the basic system noise within the near carrier analyzer itself, threshold test attenuator 64 inserts sufficient attenuation to insure adequate suppression of the nulled signal carrier, permitting valid measurement of the internal system noise. This process is commonly referred to as threshold determination.

The threshold measurement function is a fundamental part of a valid FM noise measurement. The threshold measurement establishes three basic pieces of information required for doing an FM noise measurement. First, and probably the most important, measurement of the threshold firmly establishes whether the signal under test is being measured or if the actual measurement is in reality internal equipment noise measurement. This fact must be established everytime a noise measurement is implemented. Second, the threshold measurement establishes the basis for determining if a data correction needs to be made on the measured signal data because the separation between the signal power level and threshold power level is not adequate to insure valid data from the input signal sidebands. Thus, for example, threshold correction may be required to obtain valid data when the measured signal data is less than 10 db above the measured threshold. If 10 db or more separation exists between the two power levels, data correction is not required; and, third, if the signal under analysis is separated by less than 10 db from the measured threshold, the measured threshold power can be used to correct the measured signal level. Details of the technique for correction of measured data are disclosed in a paper by J. R. Ashley, et al, "The Measurement of Oscillator Noise at Microwave Frequencies", in the IEEE Transactions on Microwave Theory and Techniques, Volume MTT-16, No. 9, September 1968 page 758.

After passing through threshold test attenuator 64, the nulled signal carrier is applied to balanced phase detector 42, for measurement of FM noise. Balanced phase detector 42 operates as a quadrature phase detector using the reference channel variable phase shifter 38 to adjust the phase of the reference signal until the reference channel signal and the signal channel signal are in quadrature. The output signal from balanced phase detector 42 is a baseband signal representing the translated FM noise from the input signal under test. The baseband signals coupled from detector 42 are then applied to established amplification, bandpass filtering and recording devices to extract the required information.

In the embodiment of FIG. 2, the signal carrier from amplifier 58 is received by circulator 70. Circulator 70 is primarily a signal routing mechanism utilized to acquire the results from the transmission line discriminator 76, permit signal carrier nulling, and then direct the processed signal through directional coupler 62 and threshold test attenuator 64 to balanced phase detector 42. The signal entering circulator 70 from input 59 is sent through fixed screw tuner 80, optimum length transmission line 76 to adjustable short 82. The signal is reflected back by short 82 through the line and is routed to detector 42. The process of sending the signal carrier through the optimum length transmission line twice allows the discrimination process to occur with one-half the amount of physical line length as would be required if only one direction of line travel is utilized. The process of nulling the signal carrier is accomplished by controlling the amount of inserted screw length into fixed screw tuner 80 and obtaining the proper setting of adjustable short 82. Adjustable short 82 alllows the phase of the reflected signal to be adjusted relative to the incoming signal while the relative amplitude of the reflected signal is adjusted by fixed tuner 80. Proper adjustment of the amplitude and phase of reflected signal allows a very effectively suppressed carrier signal to be routed through circulator 70 to balanced phase detector 42. Separation of frequency modulated sidebands from the amplitude modulated sidebands can be established to a point wherein the frequency modulated sidebands are more than 80 db larger than the amplitude modulated side bands. This process is accomplished by nulling the AM sidebands and insures that only the frequency modulated sidebands will be measured.

In the embodiment of FIG. 3, the signal entering circulator 70 from amplifier 58 is sent through slide screw tuner 74 and optimum length transmission line 76 to short circuit 78. The signal is reflected back up the path by fixed short 78 through the optimum length line to circulator 70. Sending the signal carrier through the optimum length transmission line allows nulling of the signal carrier by control of the amount of screw insertion into the transmission line and the longitudinal position at which the screw is inserted in tuner 74. Adjusting the longidudinal position of the screw in tuner 74 allows the screw to be positioned at the proper phase plane relative to the phase of the incoming signal to permit a true 180° to exist between incoming and reflected signals. The amplitude for cancellation is adjusted by the amount of screw insertion into the transmission line. Proper adjustment of the amplitude and phase of the reflected signal allows the effectively suppressed carrier signal to be routed through circulator 70 and eventually to balanced phase detector 42.

As shown in FIG. 4, the input signal carrier from amplifier 58 is received by port 86A of hybrid 86. Hybrid 86 operates as a signal routing mechanism which acquires the results from the transmission line discriminator, permits carrier nulling, and directs the processed signal through directional coupler 62 and threshold test attenuator 64 to balanced phase detector 42. The signal entering hybrid 86 at port 86A is split into two separate paths. The signal coupled through port 86D into variable attenuator 94, provides reflected signal at hybrid 86 whose amplitude can be continuously varied for adjusting amplitude. The signal coupled through port 86C into variable length transmission line 88 is subjected to the optimizing function of transmission line 76 and can be adjusted in phase by variable length transmission line 88 to provide the necessary phase shift at hybrid 86 to complete the carrier nulling operation. After combining the two reflected signals in hybrid 86 and thereby developing the signal carrier null, the nulled signal is sent through output port 86B to directional coupler 62 and balanced phase detector 42. The process of nulling the signal carrier can be accomplished by alternately adjusting variable length transmission line 88 and variable attenuator 94 to adjust the phase and amplitudes appropriately such that the signals returning from the two reflected paths are exactly 180 degress out of phase and precisely equal in amplitude to permit optimum carrier cancellation to occur at the hybrid port 86B feeding directional coupler 62. In this approach to carrier nulling, adjustable length line 90 may be omitted if desired and short circuit 82 and 92 may be fixed shorts or adjustable shorts which remain unchanged during the nulling process.

Alternatively, in FIG. 4, the variable line 88 and adjustable line 90 may be omitted with carrier nulling accomplished by adjusting short circuit 82 for phase shift adjustment and attenuator 94 for amplitude.

Similarly, in FIG. 4, the variable length line may be omitted and other components remain coupled to hybrid 86 with the phase adjustment during nulling being accomplished by adjusting the length of line 90, relative to the fixed return from the optimum length line. Thus all of the adjustments are accomplished with the elements of one path rather than requiring adjustments in both lines. Just as the adjustable length line 90 may adjust the phase relationship, this line can be omitted and the phase relationship adjusted by short circuit 92.

In the embodiment of FIG. 1 wherein stable local oscillator 28 allows the intermediate frequency to be developed through superheterodyning with the carrier input, and wherein discriminator element 60 as disclosed in FIG. 5 is a high Q microwave cavity resonator 72, the combination operates in conjunction to allow wideband operation with a single cavity. For this embodiment a relatively high IF allows the highly sensitive discriminator aspects of the high Q cavity to be employed. Oscillator 28 is not directly phase related to the input signal frequency. This is tolerable since, during calibration of the analyzer, phase shifter 34 is adjusted for a phase or frequency modulation null response at detector 42. These subtle changes impact the operation of the analyzer in FM noise measurements at the substantially low signal levels involved. Since both the input carrier signal and the local oscillator signal nulling is independently satisfied during calibration, both signals need remain relatively stable with respect only to each other and the resonant cavity, not to an absolute standard.

During alignment the high Q cavity resonator 72 is replaced by a low VSWR load. Circulator 70 is adjusted for a null while observing analyzer 66. A null on the order 100 db of signal separation between the input 59 to circulator 70 and the feedthrough of circulator 70 directly into directional coupler 62 is attained. This minimizes the inherent circulator feedthrough power to a negligible level. After this nulling adjustment, cavity resonator 72 is coupled back to the circulator and tuned to the IF signal carrier, which includes the input iris coupling within the cavity input port being adjusted for critical coupling. At this critical coupling the reflected signal carrier from cavity 72 may be nulled to a value near 60 db or less which satisfies most rigid requirements and provides a tuned discriminator element at IF.

A related discriminator device is disclosed in a copending application Ser. No. 718,691 filed Aug. 30, 1976, entitled "Superheterodyne Noise Measuring Discriminator" by J. R. Ashley, T. A. Barley, and G. J. Rast, Jr. This co-pending application was filed simultaneously with applicants' application and assigned to the US Government as represented by the Department of Army.

Several alternative embodiments have been given to the preferred embodiment of FIG. 1. Obviously modification and variations of the present invention are even further possible in light of the above disclosure and will become apparent to those knowledgeable in the art. It is, therefore, to be understood that within the scope of the appended claims, the invention may be practiced otherwise than as specifically disclosed herein.

We claim:

1. A wide operating frequency range analyzer for measuring input carrier frequency signals of very low signal level comprising:
 first and second power dividers each having an input and first and second outputs, the input of said first divider being coupled to receive said input carrier signals; first and second balanced mixers each having first and second inputs and an output, the first input of said first mixer being coupled to the first output of said first divider, the second input of said first mixer being connected to the first output of said second divider, the first input of said second mixer being coupled to the second output of said second power divider and the second input of said second mixer being coupled to the second output of said first power divider for providing superheterodyne mixing of signals coupled thereto; oscillator means coupled to said second power divider input for providing a local oscillation signal thereto; quadrature detection means having first and second inputs and an output, said second input being coupled to the output of said second mixer, the output of said detection means being disposed to couple output signals therefrom; discriminator means coupled between the output of said first mixer and the first input of said detection means; and wave analyzer means coupled to receive said detection means output signals.

2. A wide operating frequency range analyzer as set forth in claim 1 and further comprising an adjustable attenuator and a bandpass filter coupled in series to the input of said first power divider for coupling said input carrier signals thereto, said attenuator being disposed to receive said input carrier signals; a variable attenuator, variable phase shifter and an amplifier coupled in series between the output of said second mixer and the second input of said quadrature detection means; a variable attenuator and an amplifier coupled in series between the output of said first mixer and the input of said discriminator means; a directional coupler and a threshold attenuator coupled in series between the output of said discriminator and said first input of said quadrature detector; and a spectrum analyzer coupled to said directional coupler for receiving a portion of the signal passing therethrough.

3. A wide operating frequency range analyzer as set forth in claim 2 and further comprising a phase shifter coupled between the second output of said second power divider and the first input of said second mixer; and said oscillator means is a stable local oscillator.

4. A wide operating frequency range analyzer as set forth in claim 3 wherein said discriminator means is a circulator having an input port coupled to receive said first mixer output, an output port coupled to said quadrature detection means, and an input-output port; an optimum length transmission line; a tuner coupled between said input-output port and said optimum length line, and a short circuit coupled to said optimum length line for reflecting signals therethrough.

5. A wide operating frequency range analyzer as set forth in claim 3 wherein said discriminator means is a four-port hybrid having first and second ports coupled between said first mixer output and said quadrature detection means; a first short circuit; an optimum length transmission line coupled between the short circuit and a third port of said four-port hybrid; a second short circuit; and a variable attenuator coupled between said second short circuit and a fourth port of said hybrid.

6. A wide operating frequency range analyzer as set forth in claim 5 wherein said discriminator means further comprises an adjustable length transmission line coupled between said second short circuit and said variable attenuator.

7. A wide operating frequency range analyzer as set forth in claim 5 wherein said discriminator means further comprises a variable length transmission line coupled between said optimum length line and said third hybrid port.

8. A wide operating frequency range analyzer as set forth in claim 2 wherein said discriminator means is a circulator having an input port coupled to said first mixer output, an output port coupled to said quadrature detection means, and an input-output port; and a high Q cavity resonator coupled to said input-output port.

* * * * *